United States Patent
Hsin

(10) Patent No.: US 7,368,795 B2
(45) Date of Patent: May 6, 2008

(54) IMAGE SENSOR MODULE WITH PASSIVE COMPONENT

(75) Inventor: Chung Hsien Hsin, Hsinchu Hsien (TW)

(73) Assignee: Kingpak Technology Inc., Hsinchu Hsien (TW)

(*) Notice: Subject to any disclaimer, the term of this patent is extended or adjusted under 35 U.S.C. 154(b) by 154 days.

(21) Appl. No.: 11/317,071

(22) Filed: Dec. 22, 2005

(65) Prior Publication Data

US 2007/0145569 A1 Jun. 28, 2007

(51) Int. Cl.
*H01L 27/14* (2006.01)
*H01L 23/02* (2006.01)

(52) U.S. Cl. .................. 257/431; 257/432; 257/434; 257/680; 257/730; 257/731; 257/E33.068; 257/33.073; 257/23.004

(58) Field of Classification Search ........ 257/678–733, 257/787–796, 923, 924, E23.001–E23.194, 257/E21.499–E21.519, 98–100, 431–434, 257/E33.068, E33.073; 438/15, 26, 51, 55, 438/64, 106, 124–127
See application file for complete search history.

(56) References Cited

U.S. PATENT DOCUMENTS 5,821,532 A * 10/1998 Beaman et al. ............. 250/239
6,686,588 B1 * 2/2004 Webster et al. ............. 250/239
7,056,756 B2 * 6/2006 Sugahara et al. ............ 438/47
7,105,904 B2 * 9/2006 Choi .......................... 257/432
7,168,161 B2 * 1/2007 Hanada et al. .............. 29/841
2006/0223216 A1 * 10/2006 Chang et al. ................. 438/64

* cited by examiner

*Primary Examiner*—Jasmine Clark
(74) *Attorney, Agent, or Firm*—Pro-Techtor Int'l Services

(57) ABSTRACT

An image sensor module includes a flexible printed circuit board having an upper surface, which is formed with electric circuits and a lower surface. A passive component is arranged on the upper surface of the circuit board. A substrate has a first surface, a second surface and a penetrated hole. The second surface of the substrate is mounted on the upper surface of the circuit board so that the passive component is located within the penetrated hole. A chip is mounted on the first surface of the substrate, and is located onto the penetrated hole. Wires are electrically connected to the chip and the substrate. A lens holder is mounted on the first surface of the substrate and formed with an internal thread. A lens barrel is formed with an external thread screwed on the internal thread and is formed with an opening, an aspheric lens and an infrared filter.

2 Claims, 2 Drawing Sheets

IMAGE SENSOR MODULE WITH PASSIVE COMPONENT

BACKGROUND OF THE INVENTION

1. Field of the Invention

The invention relates to an image sensor module with a passive component, and more particularly to a structure for packaging an image sensor module, wherein the size of the package may be decreased and the manufacturing cost may be decreased.

2. Description of the Related Art

Referring to FIG. 1, an image sensor module structure includes a substrate 10, a frame layer 18, a chip 26, a plurality of wires 28, a transparent layer 34, a lens holder 35 and a lens barrel 46.

The substrate 10 has a first surface 12 on which a plurality of first electrodes 15 is formed, and a second surface 14 on which a plurality of second electrodes 16 is formed, wherein the first electrodes 15 are correspondingly electrically connected to the second electrodes 16.

The frame layer 18 has an upper surface 20 and a lower surface 22, and the lower surface 22 of the frame layer 18 is adhered onto the first surface 12 of the substrate 10 to form a cavity 24.

The chip 26 is arranged on the first surface 12 of the substrate 10, and is located within the cavity 24 and formed with bonding pads 27.

The wire 28 has a first end 30 and a second end 32, wherein the first end 30 is electrically connected to the bonding pad 27 of the chip 26, and the second end 32 is electrically connected to the first electrode 15 of the substrate 10.

The transparent layer 34 is adhered onto the upper surface 20 of the frame layer 18.

The lens holder 35 has an upper end surface 36, a lower end surface 40 and a penetrated region 42, which is formed with an internal thread 44.

The lens barrel 46 is formed with an external thread 39 screwed on the internal thread 44 of the lens holder 35, and is further formed with an opening 47, an aspheric lens 481 and an infrared filter 49.

Please refer to FIG. 2, the substrate 10 is mounted on a flexible printed circuit board 55, and the second electrodes 16 of the substrate 10 are electrically connected to the flexible printed circuit board 55, which is formed with a passive component 57. Thus, the module can be connected to an electrical device by the flexible printed circuit board 55.

SUMMARY OF THE INVENTION

An object of the invention is to provide an image sensor module with a passive component so that the size of the module can be decreased.

Another object of the invention is to provide an image sensor module with a passive component so that the reliability of the module can be increased.

To achieve the above-mentioned objects, the invention provides a flexible printed circuit board having an upper surface, which is formed with a plurality of electric circuits, and a lower surface. At least a passive component is arranged on the upper surface of the flexible printed circuit board. A substrate has a first surface, a second surface and a penetrated hole. The second surface of the substrate is mounted on the upper surface of the flexible printed circuit board so that the passive component is located within the penetrated hole. A chip is mounted on the first surface of the substrate, and is located onto the penetrated hole of the substrate. A plurality of wires is electrically connected to the chip and the substrate. A lens holder is mounted on the first surface of the substrate, and is formed with an internal thread. A lens barrel is formed with an external thread screwed on the internal thread of the lens holder, and is formed with an opening, an aspheric lens and an infrared filter.

DETAILED DESCRIPTION OF THE INVENTION

Figure 1:
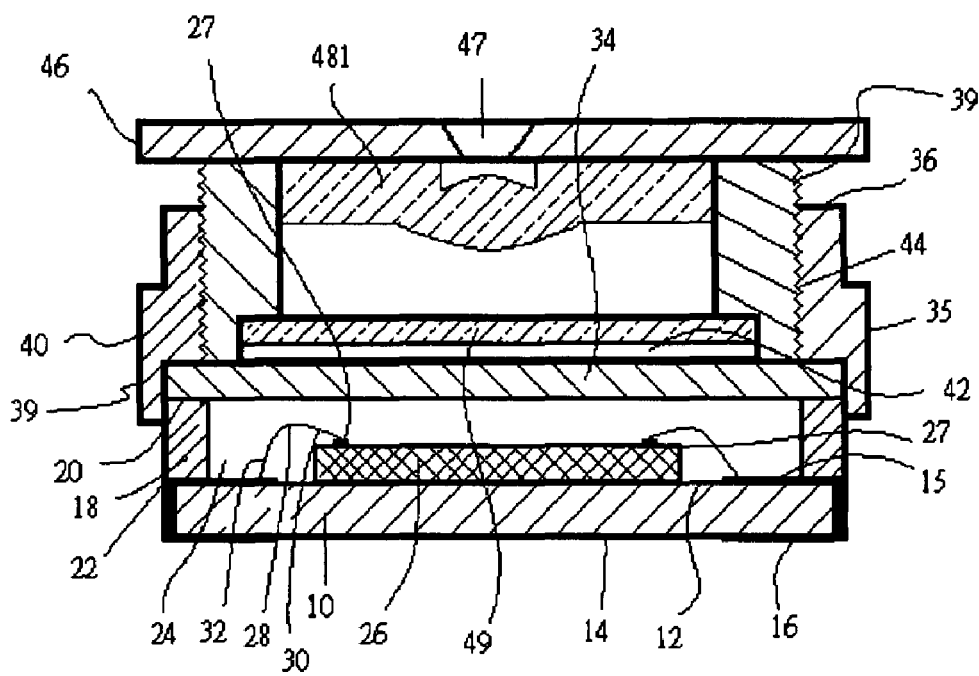
FIG. 1 is a cross-sectional view showing a conventional image sensor module package.
Figure 2:
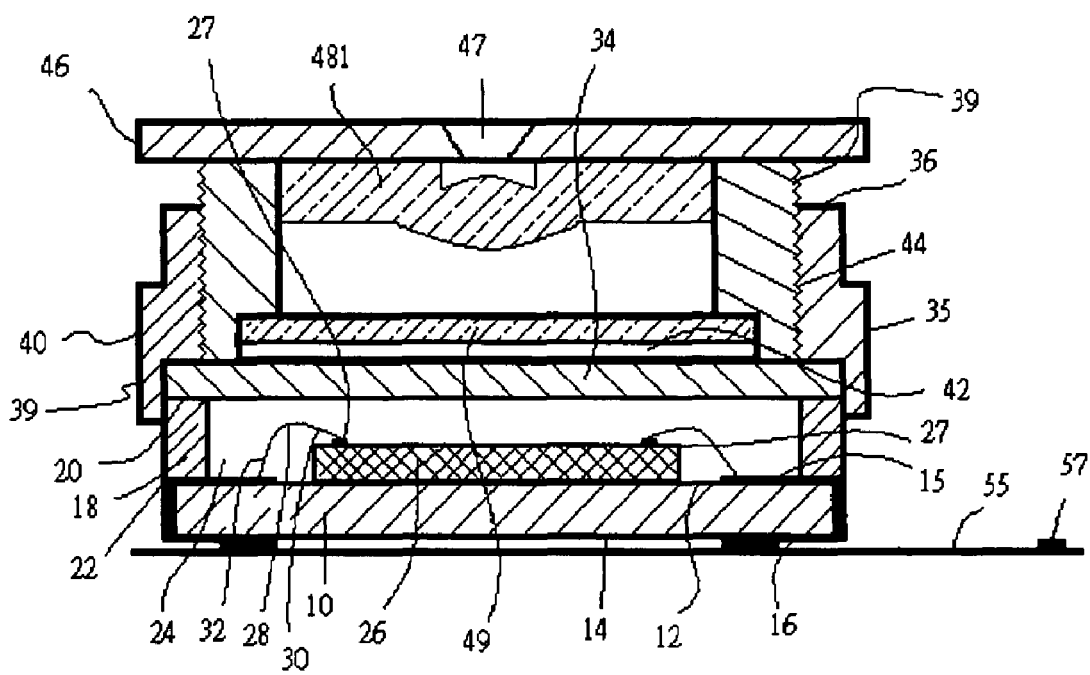
FIG. 2 is a schematic illustration showing another conventional image sensor module package.
Figure 3:
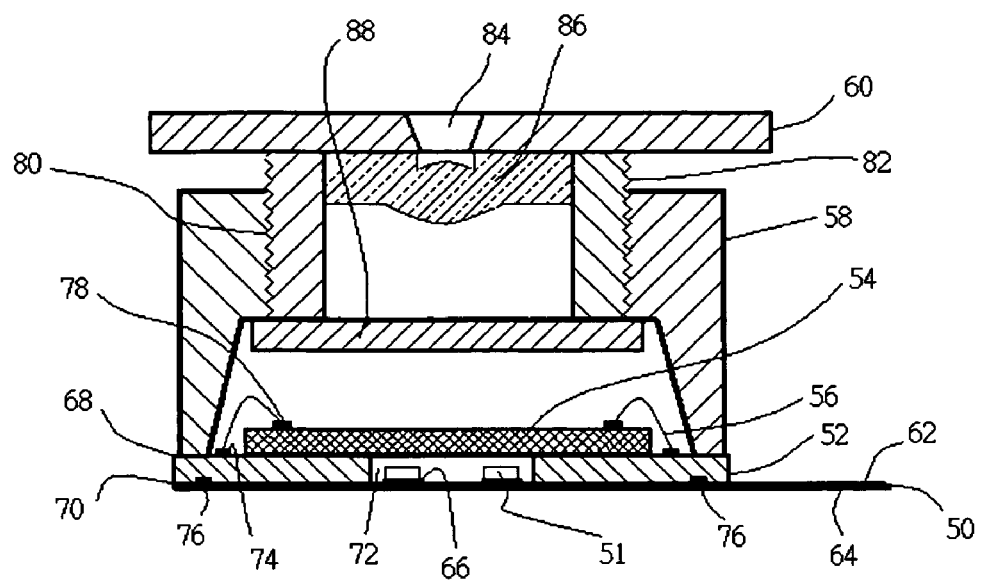
FIG. 3 is a first illustration showing an image sensor module with a passive component of the present invention.

Please refer to FIG. 3, an image sensor module includes a flexible printed circuit board 50, a passive component 51, a substrate 52, a chip 54, wires 56, a lens holder 58 and a lens barrel 60.

The flexible printed circuit board 50 has an upper surface 62, which is formed with a plurality of electric circuits 66, and a lower surface 64.

The passive component 51 is arranged on the upper surface 62 of the flexible printed circuit board 50, and is electrically connected to the electric circuits 66 of the flexible printed circuit board 50.

The substrate 52 has a first surface 68, a second surface 70 and a penetrated hole 72, wherein the first surface 68 is formed with first electrodes 74, the second surface 70 is formed with second electrodes 76, the second surface 70 of the substrate 52 is mounted on the upper surface 62 of the flexible printed circuit board 50, and the second electrodes 76 of the substrate 52 are electrically connected to the electric circuits 66 of the flexible printed circuit board 50 so that the passive component 51 is located within the penetrated hole 72.

The chip 54 is mounted on the first surface 68 of the substrate 52, and is located onto the penetrated hole 72 of the substrate 52. The chip 54 is formed with bonding pads 78.

The wires 56 are electrically connected to the bonding pads 78 of the chip 54 and the first electrodes 74 of the substrate 52.

The lens holder 58 is mounted on the first surface 68 of the substrate 52 to surround the chip 54, and is formed with an internal thread 80.

The lens barrel 60 is formed with an external thread 82 screwed on the internal thread 80 of the lens holder 58, and the lens barrel 60 is formed with an opening 84, an aspheric lens 86 and an infrared filter 88.

Figure 4:
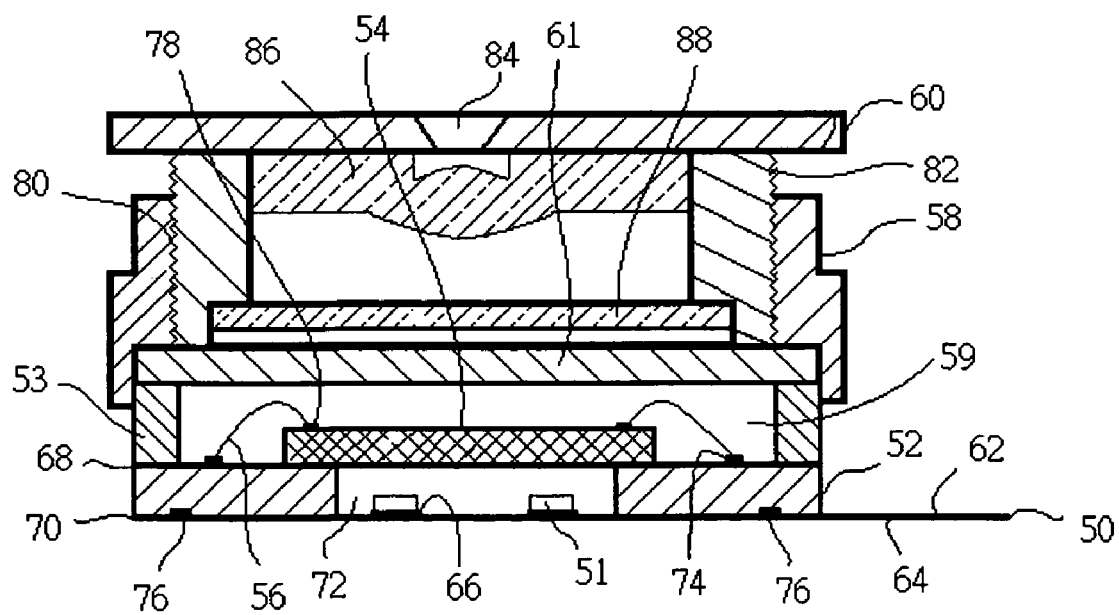
FIG. 4 is a second illustration showing an image sensor module with a passive component of the present invention.

Please refer to FIG. 4, an image sensor module includes a flexible printed circuit board 50, a passive component 51, a substrate 52, a frame layer 53, a chip 54, wires 56, a lens holder 58 and a lens barrel 60.

The flexible printed circuit board 50 has an upper surface 62, which is formed with a plurality of electric circuits 66, and a lower surface 64.

The passive component 51 is arranged on the upper surface 62 of the flexible printed circuit board 50, and is electrically connected to the electric circuits 66 of the flexible printed circuit board 50.

The substrate 52 has a first surface 68, a second surface 70 and a penetrated hole 72, wherein the first surface 68 is formed with first electrodes 74, the second surface 70 is formed with second electrodes 76, the second surface 70 of the substrate 52 is mounted on the upper surface 62 of the flexible printed circuit board 50, and the second electrodes 76 of the substrate 52 are electrically connected to the electric circuits 66 of the flexible printed circuit board 50 so that the passive component 51 is located within the penetrated hole 72.

The frame layer 53 is arranged on the first surface 68 of the substrate 52 to form a cavity 59.

The chip 54 is mounted on the first surface 68 of the substrate 52, and is located within the cavity 59. The chip 54 is formed with bonding pads 78.

The wires 56 are electrically connected to the bonding pads 78 of the chip 54 and the first electrodes 74 of the substrate 52.

The transparent layer 61 is mounted on the frame layer 53 to cover the chip 54.

The lens holder 58 is mounted on the frame layer 53, and is formed with an internal thread 80.

The lens barrel 60 is formed with an external thread 82 screwed on the internal thread 80 of the lens holder 58, and the lens barrel 60 is formed with an opening 84, an aspheric lens 86 and an infrared filter 88.

While the invention has been described by the way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor module, comprising:
   a flexible printed circuit board having an upper surface, which is formed with a plurality of electric circuits, and a lower surface;
   at least a passive component arranged on the upper surface of the flexible printed circuit board and electrically connected to the electrical circuits;
   a substrate having a first surface, a second surface and a penetrated hole, wherein the first surface is formed with first electrodes, the second surface is formed with second electrodes, the second surface of the substrate is mounted on the upper surface of the flexible printed circuit board so that the passive component is located within the penetrated hole;
   a chip mounted on the first surface of the substrate and located onto the penetrated hole of the substrates;
   a plurality of wires electrically connected to the chip and the first electrodes of the substrate;
   a lens holder mounted on the first surface of the substrate and formed with an internal thread; and
   a lens barrel formed with an external thread screwed on the internal thread of the lens holder, wherein the lens barrel is formed with an opening, an aspheric lens and an infrared filter.

2. The image sensor module according to claim 1, wherein the second electrodes of the substrate are electrically connected to the electric circuits of the flexible printed circuit board.

* * * * *